D.C.AMPLIFIER
Filed Aug. 15, 1966
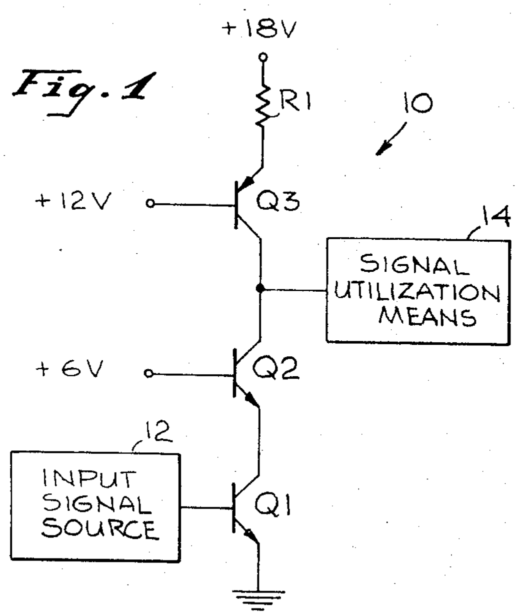
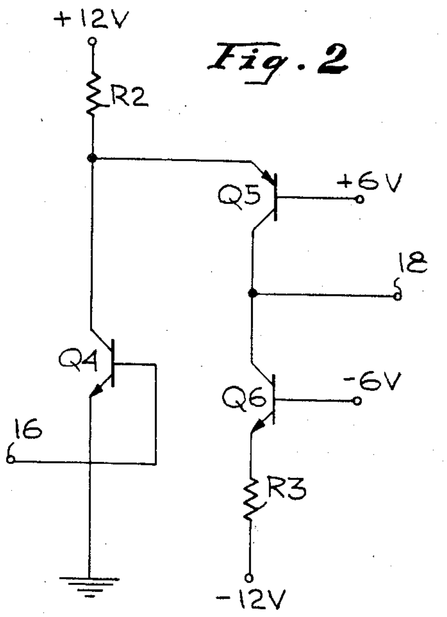
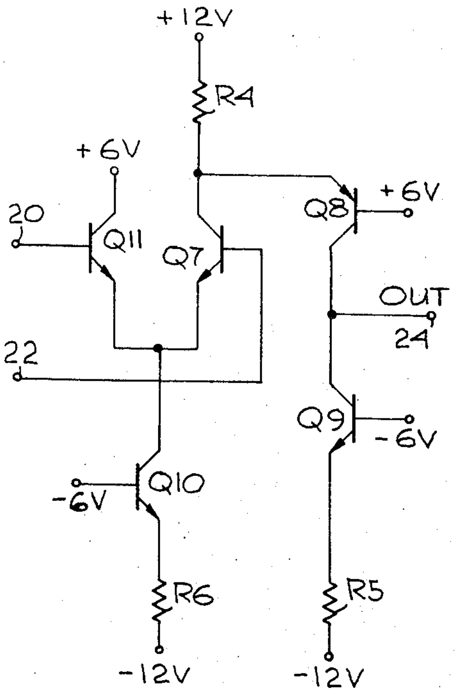
Fig. 3
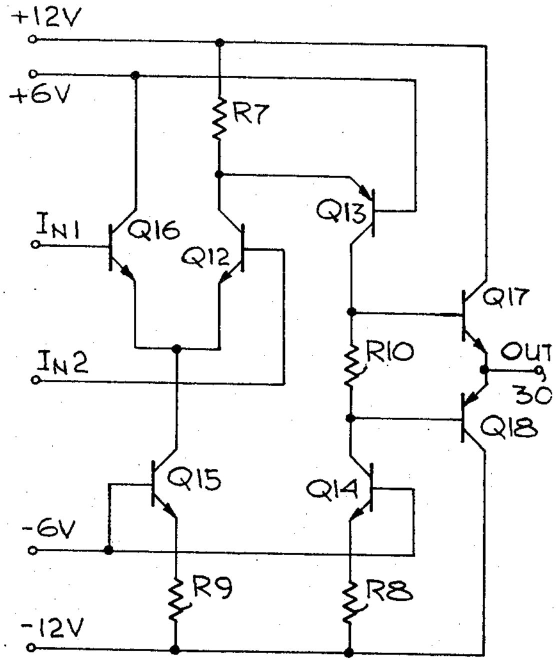
Fig. 4
INVENTOR.
ROY P. FOERSTER
BY Arthur Freilich
ATTORNEY United States Patent Office 3,451,001

Patented June 17, 1969

3,451,001

D.C. AMPLIFIER

Roy P. Foerster, Thousand Oaks, Calif., assignor to The Bunker-Ramo Corporation, Stamford, Conn., a corporation of Delaware Filed Aug. 15, 1966, Ser. No. 572,373
Int. Cl. H03f 3/18, 3/34
U.S. Cl. 330—17 7 Claims

ABSTRACT OF THE DISCLOSURE

A D.C. amplifier stage useful in an operational amplifier. The stage utilizes two transistors connected as a differential amplifier with the collector of the first transistor connected to an A.C. ground to avoid the Miller effect. The collector of the second transistor is connected to the emitter of a grounded base amplifier and through a common impedance to a source of direct current potenial. A constant current load is connected to the grounded base amplifier with an output terminal connected therebetween such that any excess current provided through the grounded base amplifier is steered through a signal utilization means connected to the output terminal resulting in a voltage gain at the output terminal. Oppositely, a decrease in current through the grounded base amplifier will draw current from the signal utilization means.

This invention relates generally to electronic circuit apparatus and more particularly to D.C. amplifiers primarily intended for use in operational amplifier applications.

The use of operational amplifiers in various systems, e.g., analog instrumentation and control systems, has increased markedly in response to the recent development of a variety of integrated circuit operational amplifiers; e.g., Westinghouse Model WS174Q and Fairchild Model μA–702. Briefly, a satisfactory operational amplifier must have a high gain, be capable of operating at high frequencies, and have a D.C. response. Generally, it may be considered as being comprised of one of more D.C. amplifier stages, each having a very high open loop gain, together with a negative feedback path for stability.

In addition, in many operational amplifier applications, it is important that the amplifier power dissipation be very low and that the gain-bandwith product be high. Typically, the most advanced prior art operational amplifiers consume 200–500 milliwatts of power and have gain-bandwidth products on the order of 3,000 megacycles. Attempts to reduce the power consumption in these prior art circuits by increasing circuit impedances to reduce stage currents have generally been unsatisfactory because of the resulting deterioration in stage response; i.e., the stage delay time increases and the higher circuit impedances result in the Miller effect becoming a limiting factor thereby further significantly slowing the stage response. Attempts to reduce the Miller effect by reducing the stage gain generally results in an increase in the delay time of the overall amplifier because a greater number of stages is required to obtain the desired overall gain.

In accordance with the present invention, an improved D.C. amplifier stage is provided capable of forming an operational amplifier having better power dissipation and gain-bandwith characteristics than known prior art devices. More particularly, an amplifier stage is provided which has a very high gain, consumes low power, and yet is not appreciably affected by the Miller effect. Thus, a minimum number of amplifier stages is required to provide a desired overall gain thereby assuring a minimum delay.

Briefly the present invention is based on the recognition that a grounded base amplifier, not subject to the Miller effect, can be used as a current-to-voltage converter in association with a constant current load to achieve a high voltage gain.

In a preferred embodiment of the invention, two transistors (which can comprise opposite halves of a dual transistor) are connected in a differential amplifier configuration with the collector of the first half being connected to an A.C. ground to avoid the Miller effect. The collector of the second half is connected to the emitter of a grounded base amplifier. A constant current load is connected to the grounded base amplifier with an output terminal connected therebetween such that any excess current provided through the grounded base amplifier is steered through a signal utilization means connected to the output terminal resulting in a voltage gain at the output terminal. Oppositely, a decrease in current through the grounded base amplifier will draw current from the signal utilization means.

It is significant that as a consequence of the simplicity of the circuit design in accordance with the invention and because of the range of component values employed, circuits in accordance with the present invention are well adapted for fabrication by thin film and monolithic integrated circuit techniques.

The novel features that are considered characteristic of this invention are set forth with particularity in the appended claims. The invention will best be understood from the following description when read in connection with the accompanying drawings, in which:

FIGURE 1 is a block schematic diagram of a first form of a single input D.C. amplifier in accordance with the present invention;

FIG. 2 is a schematic diagram of a second form of a single input D.C. amplifier in accordance with the present invention;

FIG. 3 is a schematic diagram of a differential input D.C. amplifier in accordance with the present invention; and FIG. 4 is a schematic diagram of a preferred embodiment of the invention.

Attention is now called to FIG. 1 of the drawings which illustrates a basic D.C. amplifier 10 constructed in accordance with the teachings of the present invention. The amplifier 10, of course, is intended to introduce gain between an input signal source 12 and a signal utilization means 14.

The amplifier 10 includes a first transistor Q1 illustrated as being of the NPN type and having its emitter connected to ground. The input signal source 12 is connected to the base of transistor Q1.

The collector of transistor Q1 is connected directly to the emitter of an NPN transistor Q2. The base of transistor Q2 is connected to an A.C. ground; i.e., a source of D.C. potential which is illustrated as +6 volts. The collector of transistor Q2 is connected to the collector of a PNP transistor Q3. The emitter of transistor Q3 is connected through a resistor R1 to a source of positive potential nominally shown as +18 volts. The base of transistor Q3 is connected to a source of positive potential, nominally illustrated as +12 volts. The signal utilization means 14 is connected to the collectors of transistors Q2 and Q3.

Prior to considering the operation of the circuit of FIG. 1, it would be well to recall the cause and consequences of the phenomena known as the Miller effect. Briefly, the Miller effect refers to the fact that in a signal control device, such as a transistor or a vacuum tube, the alternating current voltage on the control terminal (e.g., the base or grid) and the alternating current voltage on the output terminal (the collector or plate) act to cause the effective capacitance to be larger than the static capacitance. Moreover, the effective input capacitance increases proportionally to the voltage gain of the device. As previously pointed out, the Miller effect has represented a limiting factor in increasing the speed and reducing the power consumption of most known D.C. amplifiers. Circuit embodiments of the present invention, as illustrated in FIG. 1, are designed to avoid the Miller effect thereby enabling them to operate very fast at low power levels.

It should also be pointed out prior to describing the operation of the circuit of FIG. 1 that the transistors Q1 and Q2 are connected in what can be considered a cascade arrangement in vacuum tube parlance. That is, the output terminal of collector of transistor Q1 is connected to the input terminal or emitter of transistor Q2. As a consequence of this connection, the emitter of transistor Q2 appears like a very low impedance to transistor Q1 thereby, of course, meaning that the voltage gain of transistor Q1 is very low and as a consequence is not appreciably affected by the Miller effect. Inasmuch as the base of transistor Q2 is connected to an alternating current ground, that is a source of direct current potential, it also is not subject to the Miller effect. Transistor Q2 constitutes a current-to-voltage converter which essentially performs two functions. The initial function, as noted, is to present a low impedance to transistor Q1 to thereby avoid any appreciable Miller effect in transistor Q1. The second function of transistor Q2 is to convert current variations at the emitter thereof to voltage variations. As noted, this can be done in a manner which avoids the Miller effect by connecting the base of transistor Q2 to the alternating current ground. Transistor Q2 introduces an extremely high stage gain by connecting it to the constant current collector load Q3. Inasmuch as both transistors Q2 and Q3 effectively constitute grounded base amplifiers, their collector impedances can be very high, e.g., in the megohm range. Inasmuch as the base of transistor Q3 is connected to an A.C. ground, the Miller effect is avoided.

In the operation of the circuit of FIG. 1, initially consider that the input signal source 12 is providing a quiescent level signal such that the current drawn through transistors Q1 and Q2 is equal to the constant current provided by transistor Q3. As a consequence, no current will be driven into or drawn from the signal utilization means 14. Assume now that the input signal goes more positive thus tending to draw a greater current through the collector-emitter path of transistors Q1 and Q2 than is provided by constant current transistor Q3. This excess current is therefore drawn from the signal utilization means 14, and the potential at the collectors of transistors Q2 and Q3 will swing negative. On the other hand, if the input signal goes negative from the quiescent level, the current through transistors Q1 and Q2 will decrease. Thus, the excess current from the transistor Q3 will be steered into the signal utilization means 14 swinging the potential at the collectors of transistors Q2 and Q3 positive. Due to the very high impedance at the junction of the collectors of transistors Q2 and Q3, the voltage gain provided by the amplifier 10 can be very high, e.g., the voltage swing presented to the signal utilization means 14 can be 10,000 or more times the swing of the input voltage provided by source 12.

Although the amplifier of FIG. 1 is capable of introducing high gain while avoiding the Miller effect, it introduces a D.C. shift between input and output which would have to be compensated for by some D.C. level shifting means in order to be useful in an operational amplifier. In order to eliminate this D.C. level shift without requiring a separate level shifting means, the circuit of FIG. 1 can be rearranged as shown in FIG. 2 by effectively inverting transistors Q2 and Q3.

More particularly, in the embodiment of FIG. 2 transistors Q4, Q5, and Q6 respectively correspond to transistors Q1, Q2, and Q3 of FIG. 1. Transistor Q4 is an NPN transistor having a collector connected through a resistor R2 to a source of positive potential, nominally +12 volts, and an emitter connected to ground. The base of transistor Q4 is connected to an input terminal 16. The collector of transistor Q4 is connected to the emitter of PNP transistor Q5 whose collector is connected to the collector of NPN transistor Q6. The bases of transistors Q5 and Q6 are connected to sources of D.C. potential, +6 volts and −6 volts respectively. Resistor R3 connects the emitter of transistor Q6 to a source of negative potential, −12 volts, to form a constant current source. Output terminal 18 is connected to the collectors of transistors Q5 and Q6.

In the operation of the circuit of FIG. 2, initially consider that the input signal source is providing a quiescent level signal. The resistor R2 will supply current to both transistors Q4 and Q5 with the quiescent current level being provided to transistor Q5 being equal to the constant current drawn by the constant current load Q6. As a consequence, no current will be driven into or drawn from the signal utilization means (not shown) connected to output terminal 18. Assume now that the input signal goes more positive, thereby drawing a greater current through the collector emitter path of transistor Q4 and reducing the current in the emitter collector path of transistor Q5. As a consequence, constant current source Q6 will draw current from the output terminal 18 and the potential at the collectors of transistors Q5 and Q6 will swing negative. On the other hand, if the input signal goes negative from the quiescent level, the current through the collector emitter path of transistor Q4 will decrease thereby increasing the current through transistor Q5. This excess current cannot be absorbed by the constant current load transistor Q6 and will be driven into the signal utilization means swinging the potential at the collectors of transistors Q5 and Q6 positive.

As an approximate example, it is pointed out that the collector current of Q4 will vary approximately 3% per millivolt of base signal variation. Typically, the collector impedance of each of transistors Q5 and Q6 is 3 megohms. Therefore, assuming a 0.5 milliampere quiescent current in transistor Q4, 1.0 millivolt varies the collector current 15 microamperes. Q4 places this variation at the high impedance collector junction of transistors Q5 and Q6 where the parallel equivalent impedance is 3.0/2 or 1.5 megohms. This gives a voltage variation of $$1.5 \cdot 10^6 (15 \cdot 10^{-6}) = 22.5$$

volts or a gain of 22,500.

Thus, it should be appreciated from the explanation of FIG. 2 that a high gain D.C. amplifier has been provided which avoids the Miller effect and is therefore capable of providing a high gain-bandwidth product while operating at low power levels. The improved characteristics of the amplifier of FIG. 2 are essentially attributable to the utilization of the cascade connection operating into a constant current load.

Attention is now called to FIG. 3 which illustrates a differential input D.C. amplifier incorporating the features of FIG. 2. More particularly, transistors Q7, Q8, and Q9 illustrated in FIG. 3 correspond respectively to transistors Q4, Q5, and Q6 in FIG. 2. Similarly, resistors R4 and R5 in FIG. 3 correspond respectively to resistors R2 and R3 in FIG. 2. FIG. 3 differs from FIG. 2 in that a constant current source in the form of transistor Q10 is provided. That is, the emitter of transistor Q7 is connected to the collector of NPN transistor Q10. The emitter of transistor Q10 is connected through resistor R6 to a source of negative potential, nominally shown as −12 volts. The base of transistor Q10 is connected to an alternating current ground, i.e., a source of negative direct current potential, nominally shown as −6 volts. In addition to the transistor Q10, the circuit of FIG. 3 differs from that of FIG. 2 in that a second input transistor Q11 is provided (transistors Q7 and Q11 can comprise opposite halves of a dual transistor). More particularly, transistor Q11 comprises an NPN transistor whose emitter is connected to the emitter of transistor Q7. The collector of transistor Q11 is connected to a source of direct current positive potential, nominally shown as +6 volts, in order to avoid the Miller effect. A differential input signal is applied between input terminals 20 and 22 respectively connected to the bases of transistors Q11 and Q7. An output terminal 24 is connected between the collectors of transistors Q8 and Q9.

In the operation of the embodiment of FIG. 3, the constant current source transistor Q10 assures that the sum of the currents drawn from transistors Q11 and Q7 remains constant. Thus, in the absence of a differential input signal between terminals 20 and 22, transistors Q11 and Q7 will draw current at a quiescent, and preferably equal, level. If the voltage on terminal 20 becomes more positive than the voltage on terminal 22, then the current through transistor Q11 will increase thereby reducing the current drawn through transistor Q7. This, of course, will result in a positive voltage swing at the collectors of transistors Q8 and Q9 as described in conjunction with FIG. 2. On the other hand, if the potential on terminal 20 goes negative with respect to the potential on terminal 22, then the current through transistor Q11 will decrease thus increasing the current through transistor Q7. As a consequence, the output terminal 24 will swing negative as previously described.

Attention is now called to FIG. 4 which illustrates a preferred embodiment of the present invention incorporating the circuit of FIG. 3 and introducing an output circuit to provide a low output impedance. More particularly, the transistors Q12, Q13, Q14, Q15, and Q16 in FIG. 4 respectively correspond to the transistors Q7, Q8, Q9, Q10, and Q11 in FIG. 3. Similarly, the resistors R7, R8, and R9 in FIG. 4 respectively correspond to the resistors R4, R5, and R6 in FIG. 3. It has been pointed out that the circuits of FIGS. 2 and 3 have a high output impedance. In order to provide a low output impedance, an output circuit including transistors Q17 and Q18 is provided as shown in FIG. 4. More particularly, transistor Q17 comprises an NPN transistor whose collector is connected to a source of direct positive potential, nominally illustrated as +12 volts. The base of transistor Q17 is connected to the collector of transistor Q13. A resistor R10 is interposed between the collectors of transistors Q13 and Q14 for reasons which will be mentioned hereinafter. The emitter of transistor Q17 is connected to an output terminal 30. Transistor Q18 comprises a PNP transistor whose emitter is connected to the output terminal 30 and whose collector is connected to a source of negative direct current potential, nominally illustrated as −12 volts. The base of transistor Q18 is connected to the collector of transistor Q14.

It should be apparent that inasmuch as the collectors or output terminals of the transistors Q17 and Q18 are connected to alternating current grounds, i.e., sources of direct current potential, that they will not be subjected to the Miller effect. In the operation of the circuit of FIG. 4, when transistor Q13 draws more current than can be absorbed by the constant current transistor Q14, the excess current will provide base current to transistor Q17 thereby providing current to the output terminal 30 and swinging the voltage thereat positive. Similarly, when transistor Q13 draws less current than is absorbed by constant current source Q14, transistor Q18 draws current from the output terminal 30 swinging the potential thereat negative. The resistor R10 is provided to avoid crossover distortion between the conduction of transistors Q17 and Q18. That is, the potential drop across resistor R10 reduces the voltage swing required to switch conduction between transistors Q17 and Q18.

From the foregoing, it should be appreciated that several D.C. amplifier embodiments of the invention have been disclosed herein all of which are characterized by the absence of any appreciable Miller effect which assures fast, high gain, low power operation. These advantageous operational characteristics are primarily attributable to the use of a grounded base amplifier (transistor Q13 in FIG. 4) in conjunction with a constant current source or load (transistor Q14). Although only transistor embodiments of the invention have been disclosed herein, it should be appreciated that the teachings of the invention are applicable to other signal control devices such as vacuum tubes. It should also be appreciated that although particular voltage polarities and transistor types have been illustrated, these are merely arbitrary and can be suitably modified. It should also be recognized that various sized components can be employed in the fabrication of embodiments of the invention and these would be determined by the desired specifications.

As an example only, the following transistor types and component values are suggested for one typical embodiment of the invention:

*Resistors*

| | |
|---|---|
| R7 | 3K |
| R8 | 6K |
| R9 | 3K |
| R10 | 1K |

*Transistors*

| | |
|---|---|
| Q12–Q16 | 2N4044 |
| Q13 | 2N3502 |
| Q14 | 2N2483 |
| Q15 | 2N2483 |
| Q17 | 2N2483 |
| Q18 | 2N3502 |

An embodiment of the invention employing the above values has been found to have an open loop gain of 10,000. Moreover, the embodiment has been found to have a frequency response such that, without any frequency compensation, a feedback loop may be closed around it to give a unity gain inverter. The resultant inverter has a total delay time of 5 to 10 nanoseconds and a rise time of 25 nanoseconds. The total amplifier power consumption was on the order of 25 milliwatts. At the other extreme, the same basic circuit gave an open loop gain of about 400,000 with an upper frequency roll-off of about 30 to 50 kilocycles, again with a power consumption of about 25 milliwatts.

It is important to recognize that the parameters of a given circuit are predictable and reproducible, thus allowing the amplifier parameters to be precisely tailored to the required specifications. Also, it is significant that the simplicity of the circuit and the components and values employed enables it to be easily fabricated by thin film integrated circuit fabrication techniques.

Although several preferred embodiments of the in-
determined by the specific embodiments disclosed.
in the art falling within the spirit of the invention and
thus it is not intended that the scope of the invention be
vention have been disclosed herein, it should be under-
stood that various modifications will occur to those skilled The embodiments of the invention in which an exclusive property or privilege is claimed are defined as follows:

1. An amplifier comprising:

first and second transistors each having an emitter, a collector, and a base;

a source of input voltage;

means connecting said source of input voltage across said bases of said first and second transistors;

a first constant current source;

means connecting said first and second transistor emitters in common to said first constant current source;

means biasing said first and second transistors for driving current in a forward direction therethrough;

a third transistor of a type complementary to said second transistor, having an emitter, a collector, and a base;
- a source of direct current potential;
- a common impedance means connecting said second transistor collector and said third transistor emitter to said source of direct current potential;
- means applying a current potential to said third transistor base;
- a second constant current source connected to said third transistor collector;
- a signal utilization means; and
- output circuit means connecting said signal utilization means to said third transistor collector.

2. The amplifier of claim 1 wherein each of said first and second constant current sources includes a transistor having an emitter, a collector, and a base; and
- means respectively connecting the bases and emitters of each of said constant current source transistors to different sources of direct current potential.

3. The amplifier of claim 2 wherein said output circuit means includes forth and fifth transistors each having an emitter, a collector, and a base;
- impedance means connected between said third transistor collector and said second constant current source;
- means connecting the base of said fourth transistor to said third transistor collector; and
- means connecting the base of said fifth transistor to said second constant current source.

4. An amplifier comprising:
- first and second complementary transistors each having an emitter, a collector, and a base;
- a source of direct current potential;
- a common impedance means connecting the collector of said first transistor and the emitter of said second transistor to said source of direct current potential;
- an input terminal connected to said first transistor base for connection to an input signal source;
- a constant current load connected in series with the emitter-collector path of said second transistor; and
- an output terminal connected to the junction between said second transistor and said constant current load for connection to a signal utilization means.

5. The amplifier of claim 14 wherein said constant current load includes a third transistor having an emitter, a collector, and a base; and

- means respectively coupling said second and third transistor bases to different sources of direct current potential.

6. The amplifier of claim 14 including a third transistor having an emitter, a collector, and a base;
- a second constant current load; and
- means connecting said emitters of said first and third transistors to said second constant current load.

7. An amplifier comprising:
- first and second complementary transistors each having an emitter, a collector, and a base;
- a source of direct current potential;
- a common impedance means connecting the emitter-collector paths of each of said first and second transistors to said source of direct current potential;
- an input terminal connected to said first transistor base for connection to an input signal source;
- a constant current load connected in series with the emitter-collector path of said second transistor;
- an output impedance connected in series with said constant current load;
- third and fourth transistors each having an emitter, a collector, and a base; and
- means connecting the bases of said third and fourth transistors to opposite ends of said output impedance.

References Cited

UNITED STATES PATENTS

| | | | |
|---|---|---|---|
| 3,077,566 | 2/63 | Vosteen | 330—20 X |
| 3,163,827 | 12/64 | Kandiah | 330—20 X |
| 3,296,544 | 1/67 | Grace | 330—30 X |
| 3,309,538 | 3/67 | Ashley et al. | 330—30 X |
| 3,351,865 | 11/67 | Dow et al. | 330—18 X |

OTHER REFERENCES

Brugger: "Extending An Operational Amplifier's Bandwidth to 50-Mc.," Electronic Design, pp. 50–52, May 25, 1964."

ROY LAKE, *Primary Examiner.*

J. B. MULLINS, *Assistant Examiner.*

U.S. Cl. X.R.

330—18, 19, 20, 30